(12) United States Patent
Leija et al.

(10) Patent No.: US 7,083,449 B1
(45) Date of Patent: Aug. 1, 2006

(54) PULL LEVER LATCH APPARATUS (75) Inventors: Javier Leija, Chandler, AZ (US);
James C Shipley, Gilbert, AZ (US);
Christopher A Gonzales, Chandler, AZ (US); Christopher D Lucero, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/092,114

(22) Filed: Mar. 29, 2005

(51) Int. Cl.
*H01R 13/62* (2006.01)
(52) U.S. Cl. .................................. 439/160
(58) Field of Classification Search ............. 439/160, 439/159, 923; 361/725, 399, 754, 798
See application file for complete search history.

(56) References Cited

U.S. PATENT DOCUMENTS

| | | | |
|---|---|---|---|
| 6,185,106 B1* | 2/2001 | Mueller | 361/798 |
| 6,381,146 B1* | 4/2002 | Sevier | 361/754 |
| 6,935,868 B1* | 8/2005 | Campini et al. | 439/67 |
| 2005/0174743 A1* | 8/2005 | Downing et al. | 361/725 |

OTHER PUBLICATIONS

"Advanced TCA: PICMG 3.0 Revision 1.0", *Specification Section 2: Mechanical*, (Dec. 30, 2002), Introduction 1-24 pgs. & Specification Section 2 43-125 pgs., Total No. 107 pgs.

* cited by examiner

*Primary Examiner*—Alexander Gilman
(74) *Attorney, Agent, or Firm*—Douglas J. Ryder; Ryder IP Law, PC (57) ABSTRACT In general, in one aspect, the disclosure describes an apparatus that includes a latch to connect a board to a chassis. The apparatus further includes a pull lever to control whether said latch is retracted or extended. The latch connects the board to the chassis when it is extended.

25 Claims, 12 Drawing Sheets

PULL LEVER LATCH APPARATUS

BACKGROUND

Modular computing systems contain many boards and/or interconnects (hereinafter referred to as "boards") within a rack (chassis). These systems provide large amounts of processing in a small environment. These systems may enable boards to be replaced while the system is still in operation (hot swap boards). Accordingly, the boards within the rack need to be capable of being installed and secured or unsecured and removed from the rack. As the modular computing systems are tightly bundled, mechanisms for installing or removing boards are limited in size and configuration. Moreover, as boards are being replaced while the system is still active speed of replacement is also important.

The chassis' are often governed by standards, such as the PCI Industrial Computer Manufacturers Group (PICMG), Advanced Telecommunications Computing Architecture (ATCA) Base Specification, PIGMG 3.0 Revision 1.0, published Dec. 30, 2002 (hereinafter referred to as "the ATCA specification").

BRIEF DESCRIPTION OF THE DRAWINGS

The features and advantages of the various embodiments will become apparent from the following detailed description in which.

DETAILED DESCRIPTION

Figure 1:
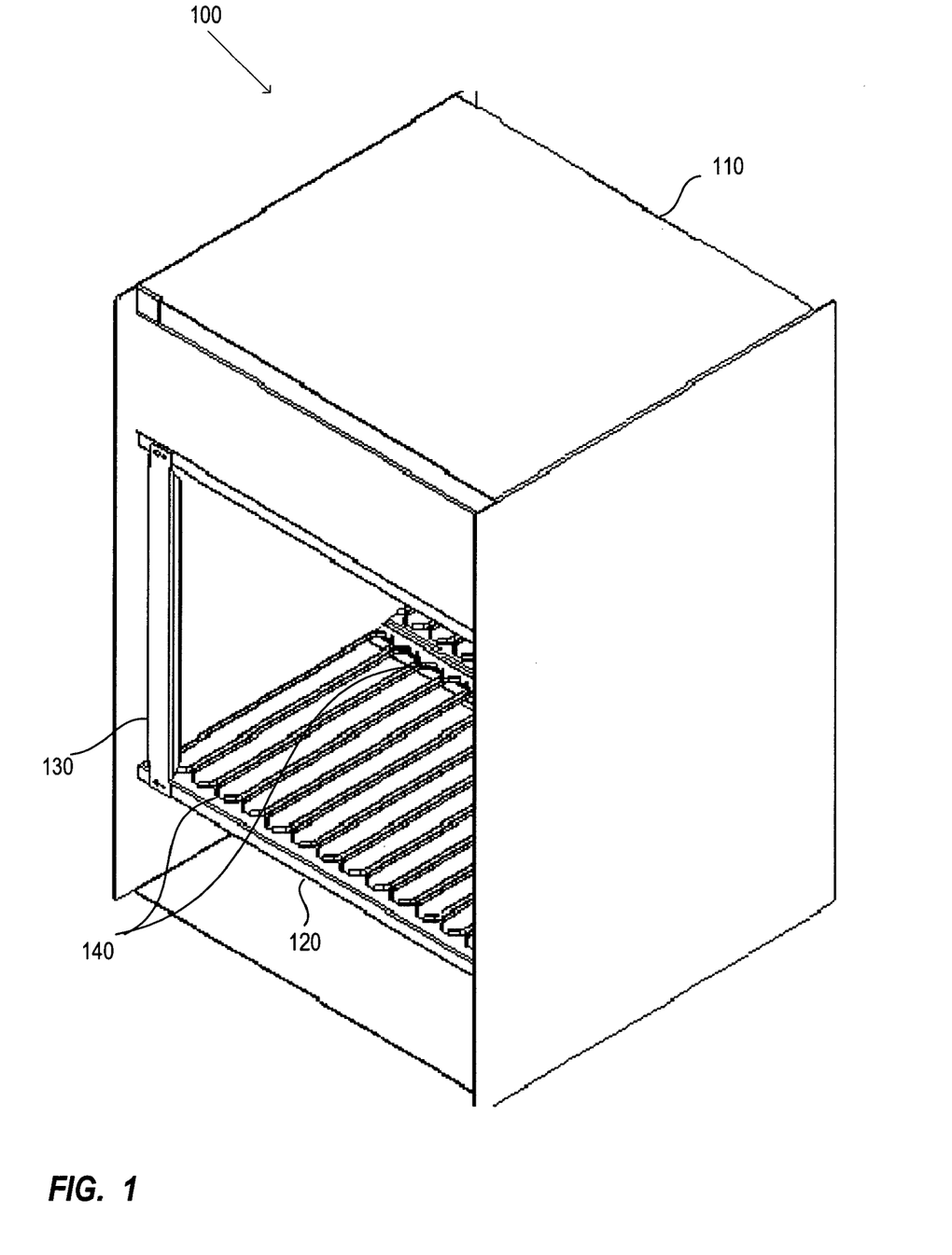
FIG. 1 illustrates a perspective view of an example chassis, according to one embodiment.

FIG. 1 illustrates a perspective view of an example chassis (rack) 100 for use with embedded computer systems. The chassis 100 includes a housing 110 (e.g., outer shell, walls) and a frame 120 for holding boards 130 (e.g., computers). Only a single board 130 is illustrated installed in the frame 120 and no components are illustrated on the board 130 for simplicity. The frame 120 consists of upper and lower rails 140 (guide rails) that guide the boards into the housing 110. It should be noted that only the lower rails 140 are visible in FIG. 1. As illustrated, the boards 130 reside vertically in the chassis 100. A back edge (not illustrated) of the boards 130 may plug into a backplane (not illustrated) for communication with other boards 130 in the chassis 100, adapters (not illustrated) for communicating external to the chassis 100, and/or a power source (not illustrated) for proving power to the boards 130.

Figure 2:
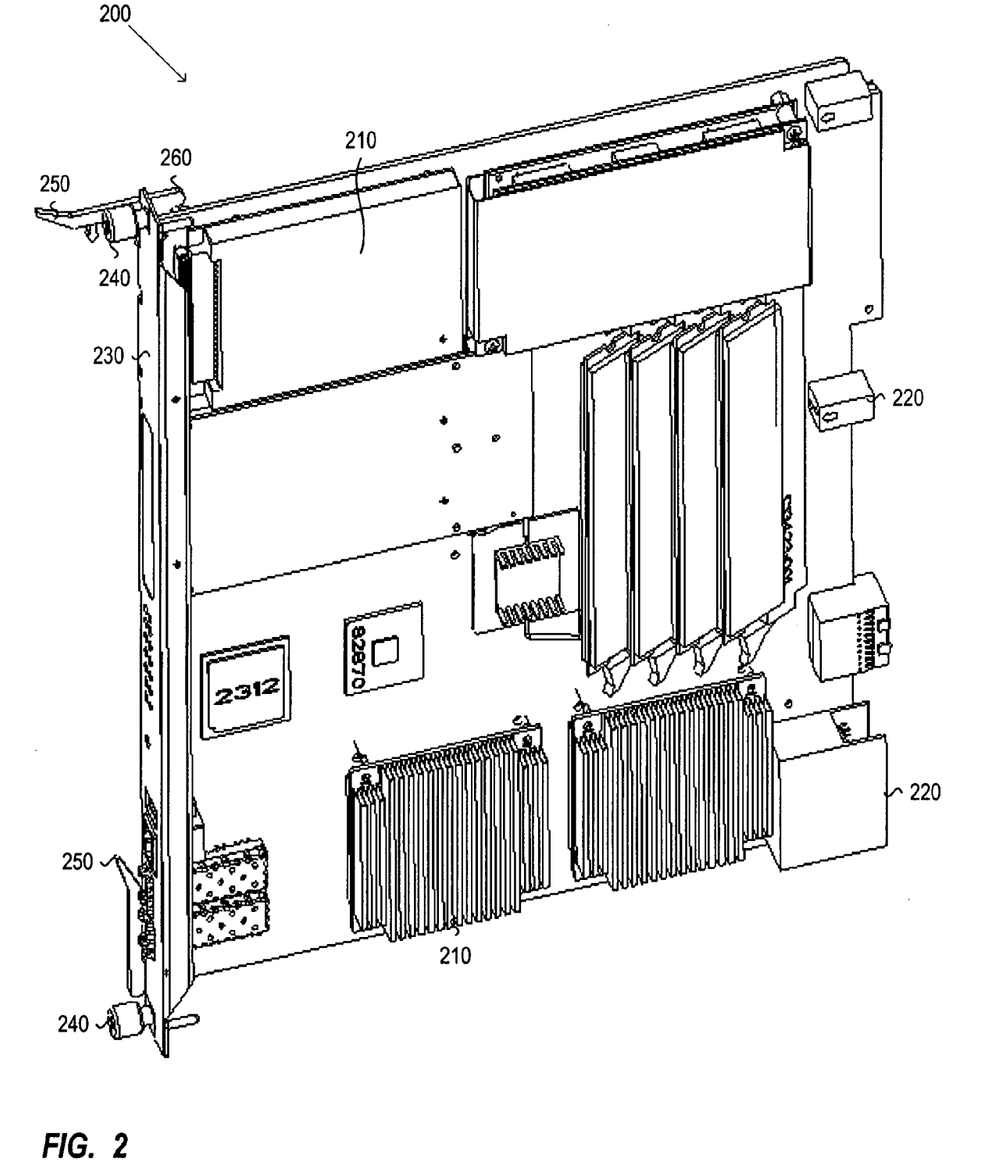
FIG. 2 illustrates a perspective view of an example board for use in a chassis, according to one embodiment.

FIG. 2 illustrates a perspective view of an example board 200 for use in the chassis (e.g., chassis 100 of FIG. 1). The board 200 includes various components 210 for performing different functions and adapters 220 for connecting to a backplane, power and/or other interfaces. The board 200 may also include a front face plate 230 to protect the board 200, to provide status indicators (e.g., LEDs that indicate status of the board), and to provide mechanisms for securing the board 200 in the chassis. The mechanisms used to secure the board 200 in the chassis may include retention screws 240 and handles 250. The retention screws 240 may be located on the edges of the face plate 230 in alignment with holes in the chassis (e.g., frame 120) when the board 200 is appropriately installed. Once the board 200 is installed the retention screws 240 may be pushed into the holes to secure the board 200 to the chassis. The handles 250 may be also be located on the edges of the face plate 230. The handles 250 may be extended (see top handle) or retracted (see bottom handle).

When the handles 250 are extended they may be used to hold the board 200. A portion of the handle 260 may extend past the face plate 230 toward the board 200 when extended (see top handle). Once the board 200 is installed in the chassis the handle 250 may be retracted (folded in). When the handle 250 is folded in the portion 260 may extend past the edge of the board 200 and possibly past the edge of the face plate 230 and help secure the board 200 to the chassis.

Securing the example board 200 to a chassis may require that the retention screws 240 be aligned and then inserted and that the handles 250 be retracted. Likewise, removing the board 200 from the chassis may require that the handles 250 both be extended and that both retention screws 240 be removed. Insertion and removal thus may require two hands of an operator.

Chassis' (e.g., 100 of FIG. 1) and boards (e.g., 200 of FIG. 2) may be a governed by standards (e.g., the ATCA specification). The standards may control, the size of the chassis, the number of slots in the chassis, the placement of the boards in the chassis, how the boards are secured in the chassis, the size of the boards, where components are mounted on the boards, interfaces to the board, electrostatic discharge (ESD) parameters, as well as other aspects. For example, the ATCA specification requires that the chassis to have an ESD wrist strap terminal and that the terminal be unpainted.

The example chassis 100 of FIG. 1 and board (e.g., ATCA blade) 200 of FIG. 2 are based on the ATCA specification. When describing various embodiments, specific reference may be made to the ACTA specification for simplicity and ease of understanding. However, the various embodiments are in no way intended to be limited by the ATCA specification or any standards for that matter. Rather, the various embodiments described herein may be applicable to any modular computing system chassis' and boards.

Figure 3:
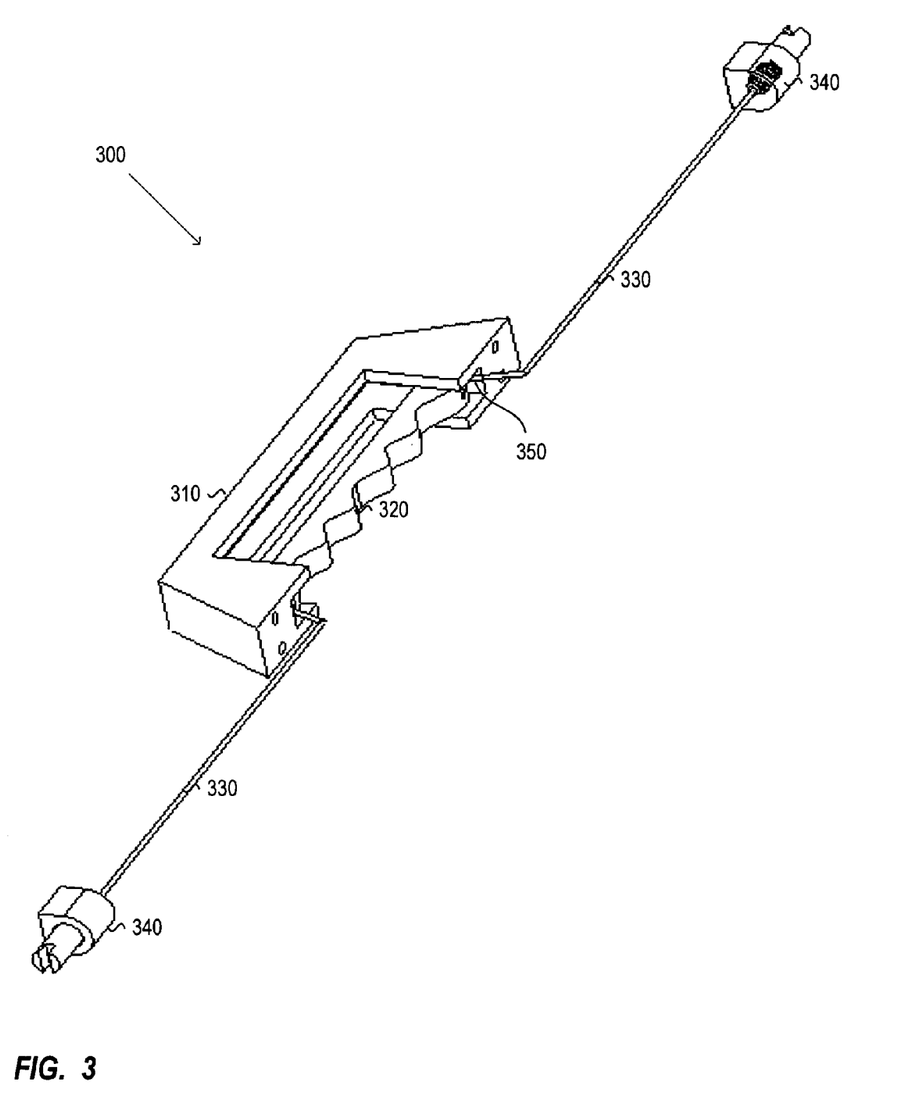
FIG. 3 illustrates a perspective view of an example latching mechanism that may be used to easily install, secure and/or remove a board to a chassis, according to one embodiment.

FIG. 3 illustrates a perspective view of an example latching mechanism 300 that may be used to easily install, secure and/or remove a board (e.g., 200) to a chassis (e.g., 100). The latching mechanism 300 may include a handle 310, a pull lever 320, cables 330 and latch assemblies 340. The pull lever 320 may be mounted within (integrated with) the handle 310 and be capable of sliding within the handle 310. As illustrated, the handle 310 has a grove 350 formed in an inner surface with which the pull lever 320 can slide. According to one embodiment, the handle 310 and the pull lever 320 may be a single component with the handle 310 being a fixed outer handle and the pull lever 320 being an internal lever that translates the fixed outer handle. The pull lever 320 may be designed to be ergonomic so a user can easily grab it with comfort. The pull lever 320 may be connected to the cables 330 and the cables 330 may in turn be connected to the latch assemblies 340. When the pull lever 320 is engaged (e.g., pulled toward the handle 310) it may pull the cables 330 toward the handle 310 which in turn pulls the latch assemblies 340 inwards (the latch assemblies 340 are retracted).

Figure 4:
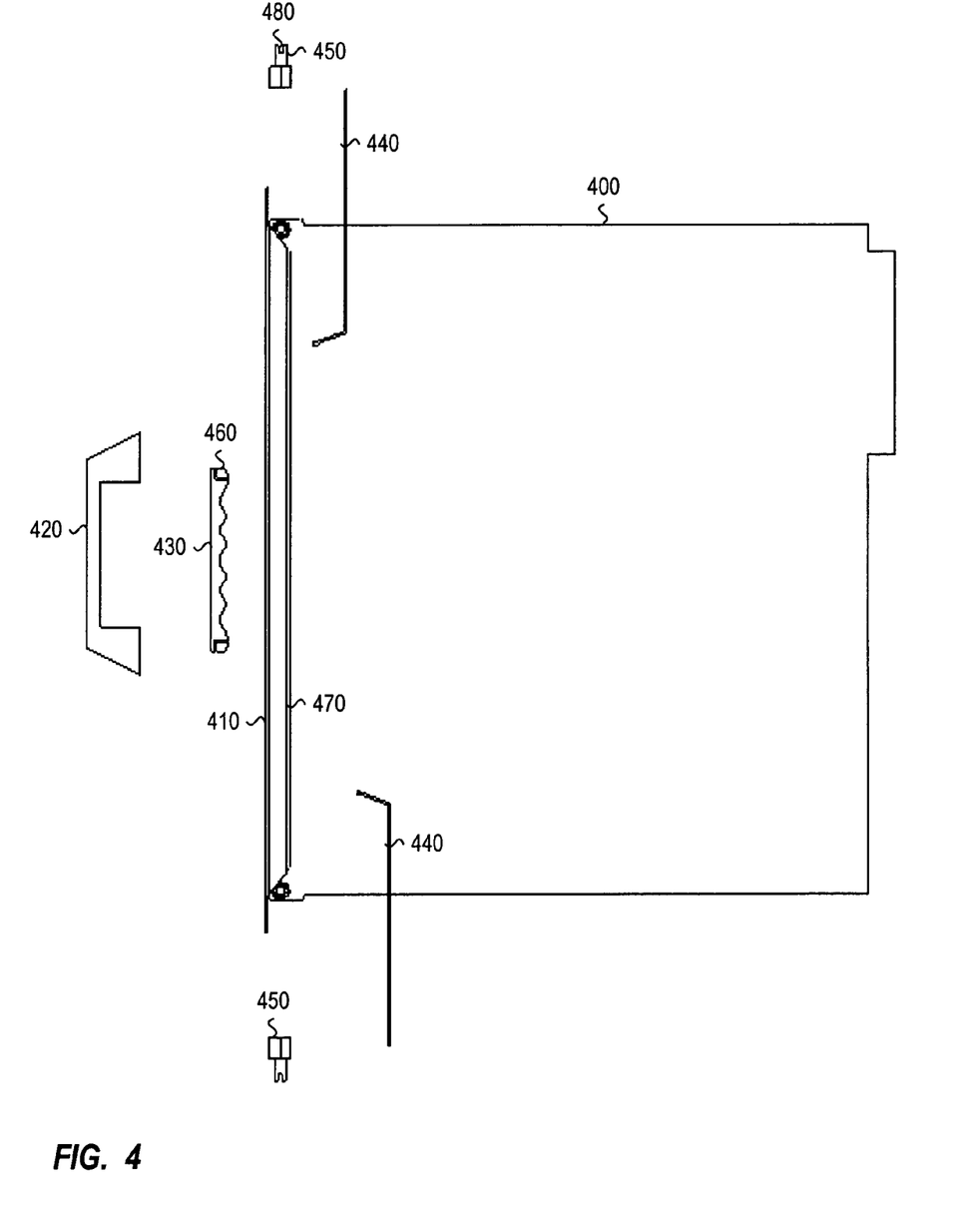
FIG. 4 illustrates an exploded view of an example latch mechanism as it would be configured to connect to a board, according to one embodiment.

FIG. 4 illustrates an exploded view of an example latch mechanism as it would be configured to connect to a board 400 (a face plate 410 of the board 400). The latch mechanism may include a handle 420, a pull lever 430, cables 440 and latch assemblies 450. The handle 420 may be mounted to a face of the face plate 410 and may be used to carry the board 400. The pull lever 430 may be capable of sliding within the handle 420. According to one embodiment, the handle 420 and the pull lever 430 may be a single component. When the pull lever 430 is in an inert position (when no pressure is applied) it may reside near the middle of the handle 420 so that there is room for the pull lever 430 to be activated (pulled toward the handle 420) and so that there is room for one to grasp the pull lever 430 (hand can fit between the pull lever 430 and the face plate 410).

The pull lever 430 may have connecters 460 for securing the cables 440. The connecters 460 may be located at the end of the pull lever 430 so as not to interfere with the grasping of the pull lever 430. The connectors 460 may be any type of connection mechanism that will secure the cables 440 to the pull lever 430 (e.g., a clip for grasping the cables 440, a hole whereby the cables 440 are inserted). The face plate 410 may have holes therein so that the cables 440 can extend through the face plate 410 and connect to the pull lever 430. The cables 440 may run along the back of the face plate 410 (bottom of the board 400) and extend to the outer edges of the face plate 410 and past the outer edge of the board 400. The cables 440 may be held to the face plate 410 using an attachment mechanism that allows the cable 440 to move along the face plate 410 when the pull lever 430 is moved. The cables 440 may be hidden by a side wall 470 of the face plate 410. The sidewall 470 may be perpendicular to the faceplate 410 and parallel to the board 400.

The other end of the cables 440 may connect to the latch assembles 450 that extend from the side of the boards 400. The latch assemblies 450 may include a mating feature 480 to engage a chassis with which the board 400 is installed. When the pull lever 430 is engaged (pulled toward the handle 420), the cables 440 are pulled inward and the latch assembles 450 are retracted (pulled inward and disengaged from the chassis). When the pull lever 430 is disengaged the cables 440 and the latch assemblies 450 are extended (engaged with the chassis).

Utilizing the latch mechanism enables a user to quickly install, engage, or remove a board 410 from the chassis. To install or remove a board 400, the pull lever 430 is engaged so that the latch assemblies 450 are retracted and the board 400 can be slid in or out of the chassis. To secure a board 400, the pull lever 430 is disengaged so that the latch assemblies 450 are extended and engage the chassis.

The cables 440 are illustrated as having a bend therein to indicate that the cables 440 extend along the bottom of the board 400 and then extend through the face plate 410. According to one embodiment, the face plate 410 may include a guide mechanism (e.g., a pulley) to assist the cables 440 in making the turn.

Figure 5:
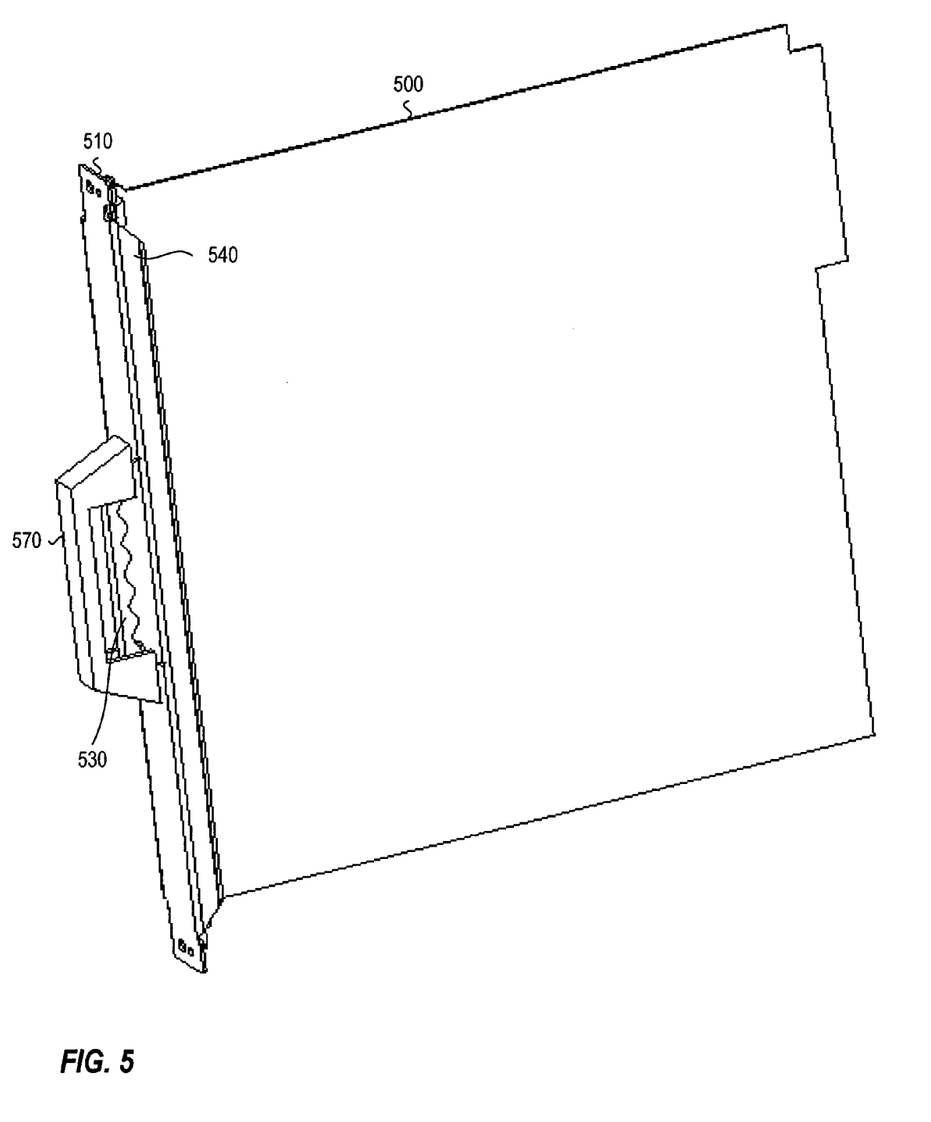
FIG. 5 illustrates a perspective view of an example latch mechanism connected to a face plate, according to one embodiment.

FIG. 5 illustrates a perspective view of an example latch mechanism connected to a face plate 510 of a board 500. The latch mechanism may include a handle 520 and pull lever 530 that are mounted to the front of the face plate 510. As previously discussed, the pull lever 530 may be mounted within and be capable of sliding within the handle 520. The latch mechanism may further include cables that connect the pull lever 530 to latch assemblies that engage a chassis. The cables may extend from the pull lever 530 through holes in the faceplate 510 and then run along the underside of the faceplate 510 to the edges of the face plate 510. At the edge of the face plate 510 the cables may connect to the latch assemblies. The latch assemblies may engage with and secure the faceplate 510 (and the board 500) to the chassis. The cable and the latch assemblies are not visible in FIG. 5 as they are hidden by a sidewall 540 of the face plate 510.

When the pull lever 530 is disengaged the latch assembly may be extended so that it connects to and secures the faceplate 510 and the board 500 in the chassis. When the pull lever 530 is engaged the latch assemblies may be retracted and the face plate 510 and the board 500 could be inserted or removed from the chassis.

Figure 6A:
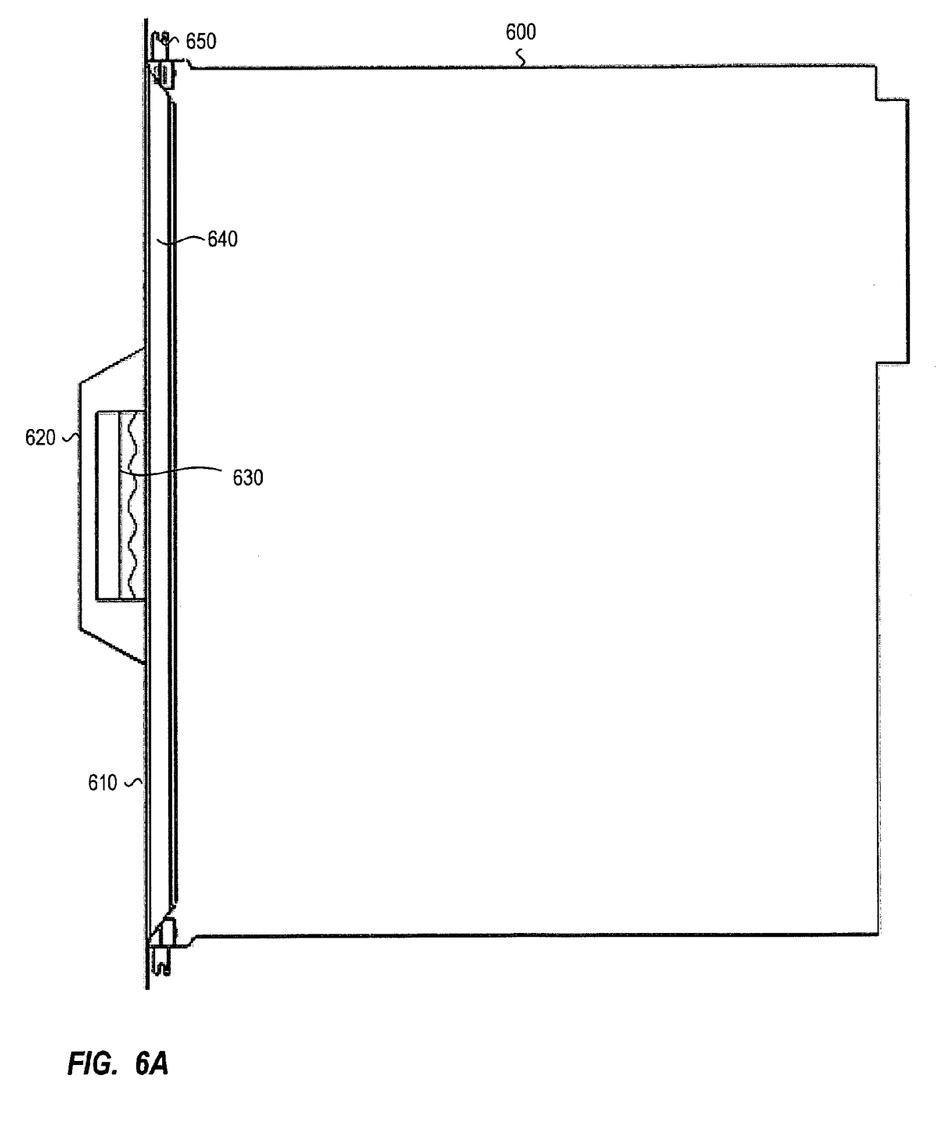
FIG. 6A illustrates an example board and face plate having a non-engaged (secured) latch mechanism, according to one embodiment.

FIG. 6A illustrates an example board 600 and face plate 610 having a non-engaged (secured) latch mechanism. The latch mechanism includes a handle 620, pull lever 630 connected to the face plate 610, and cables connecting (not visible—hidden behind side wall 640 of face plate 610) the pull lever 630 to latch assemblies 650. The pull lever 630 is not engaged (is not being pulled toward the handle 620) so that the latch assemblies 650 are extended from the side of the board 600. This would be the configuration of the board 600 when it was installed in and secured to the chassis.

Figure 6B:
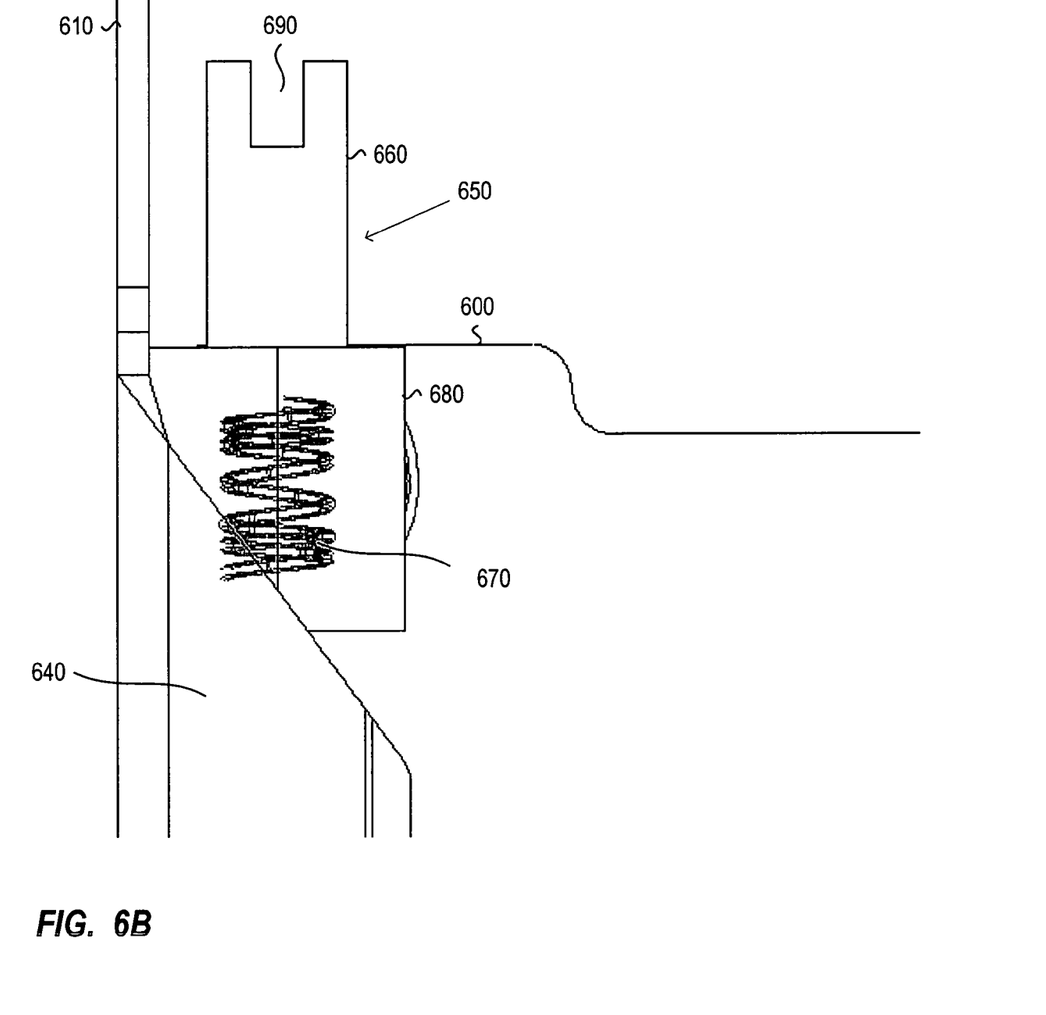
FIG. 6B illustrates a close up of an example latch assemble in an extended (secured) configuration, according to one embodiment.

FIG. 6B illustrates a close up of an example latch assembly 650 in an extended (secured) configuration. The latch assembly 650 may be in this position when the pull lever (e.g., 630 of FIG. 6A) is not engaged. The latch assembly 650 may include a latch 660, a spring 670 and a retainer 680. One end of the latch 660 is attached to the cable (not visible—hidden behind side wall 640 of face plate 610). The other end of the latch 660 has a mating feature 690 to engage the chassis (e.g., ATCA chassis). The retainer 680 is attached to the back side of the faceplate 610. The spring 670 is placed inside of the retainer 680. The retainer 680 holds the spring 670 and latch 660 in place. The latch assembly 650 is located at a position to ensure that the latch 660 engages/disengages the chassis properly. As illustrated, the spring 670 is extended and the latch 660 is extended toward the end of the face plate 610. Accordingly, the latch 660 (the mating feature 690) would be engaged with the chassis and secure the board 600 and face plate 610 in the chassis.

According to one embodiment, the latch assembly 650 may be designed with a geometry that makes it easier to install (e.g., a sloped portion facing the chassis so board 610 can be installed even without engaging (pulling) the pull lever). That is, the latch assembly need not be retracted for installation.

Figure 7A:
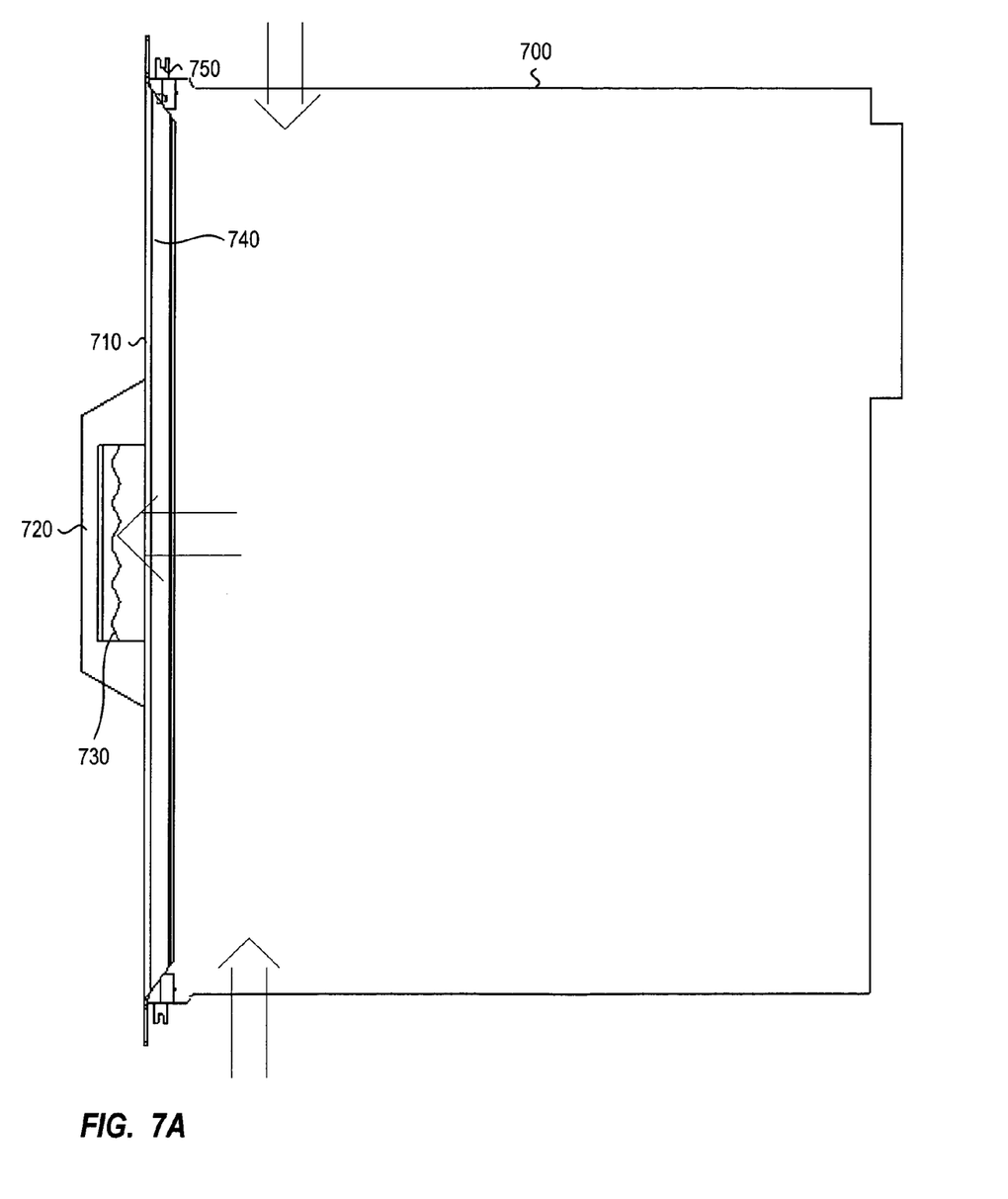
FIG. 7A illustrates an example board and face plate having an engaged (retracted) latch mechanism, according to one embodiment.

FIG. 7A illustrates an example board 700 and face plate 710 having an engaged (retracted) latch mechanism. The latch mechanism includes a handle 720 and a pull lever 730 connected to the face plate 710. The pull lever 730 is engaged (e.g., pulled toward handle 720) so that the cables (hidden by face plate side wall 740) are pulling the latch assemblies 750 toward the pull lever 730 (center of board 700). Accordingly, the latch assemblies 750 are retracted from the edge of the faceplate 710. This would be the configuration of the board 700 when the board 700 was preparing to be installed or removed from the chassis (e.g., hot swap).

Figure 7B:
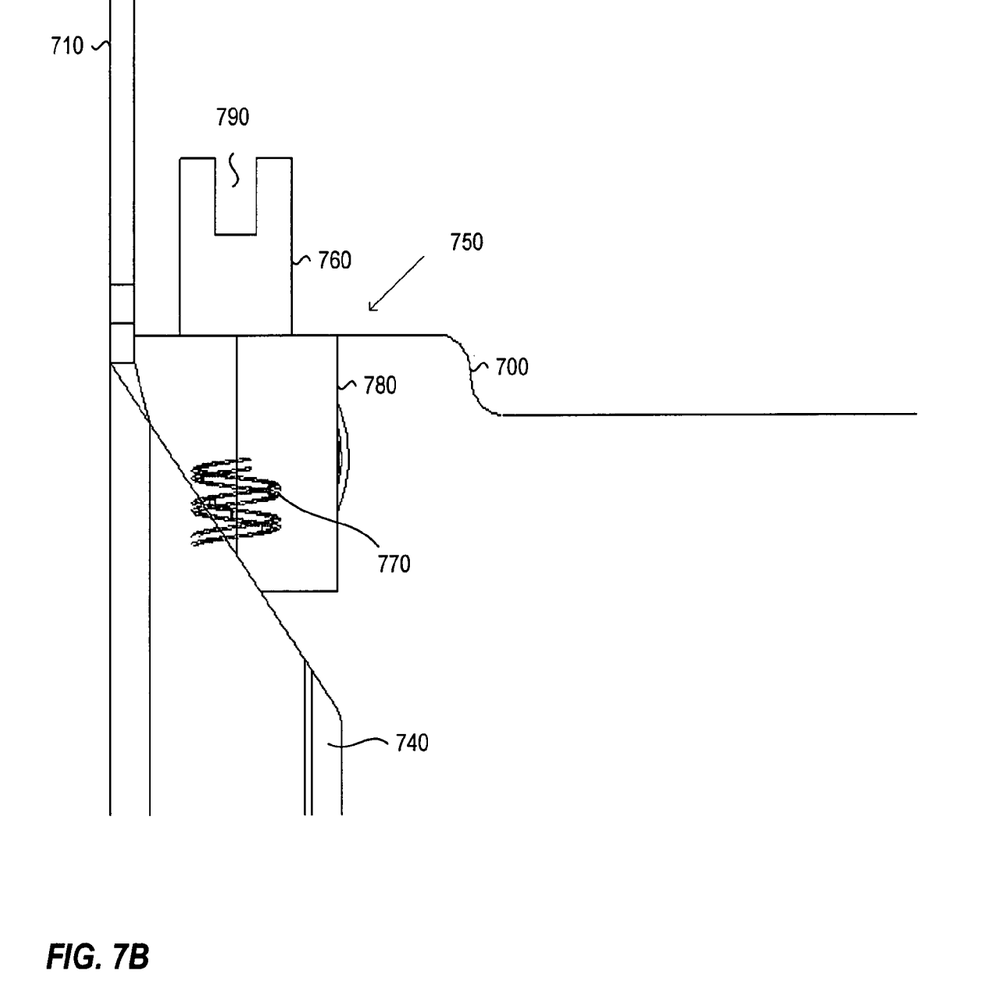
FIG. 7B illustrates a close up of an example latch assemble in a retracted (non-secured) configuration, according to one embodiment.

FIG. 7B illustrates a close up of an example latch assemble 750 in a retracted (non-secured) configuration. The latch assembly 750 may be in this position when the pull lever (e.g., 730 of FIG. 7A) is engaged. The latch assembly 750 may include a latch 760 having one end attached to the cable and the other end having a mating feature 790 to engage the chassis. The latch assembly 750 may also include a retainer 780 attached to the back side of the faceplate 710 and a spring 770 placed inside of the retainer 780. As illustrated, the spring 770 is compressed and the latch 760 is retracted from the edge of the face plate 710. Accordingly, the latch 760 would not be engaged with the chassis.

Figure 8:
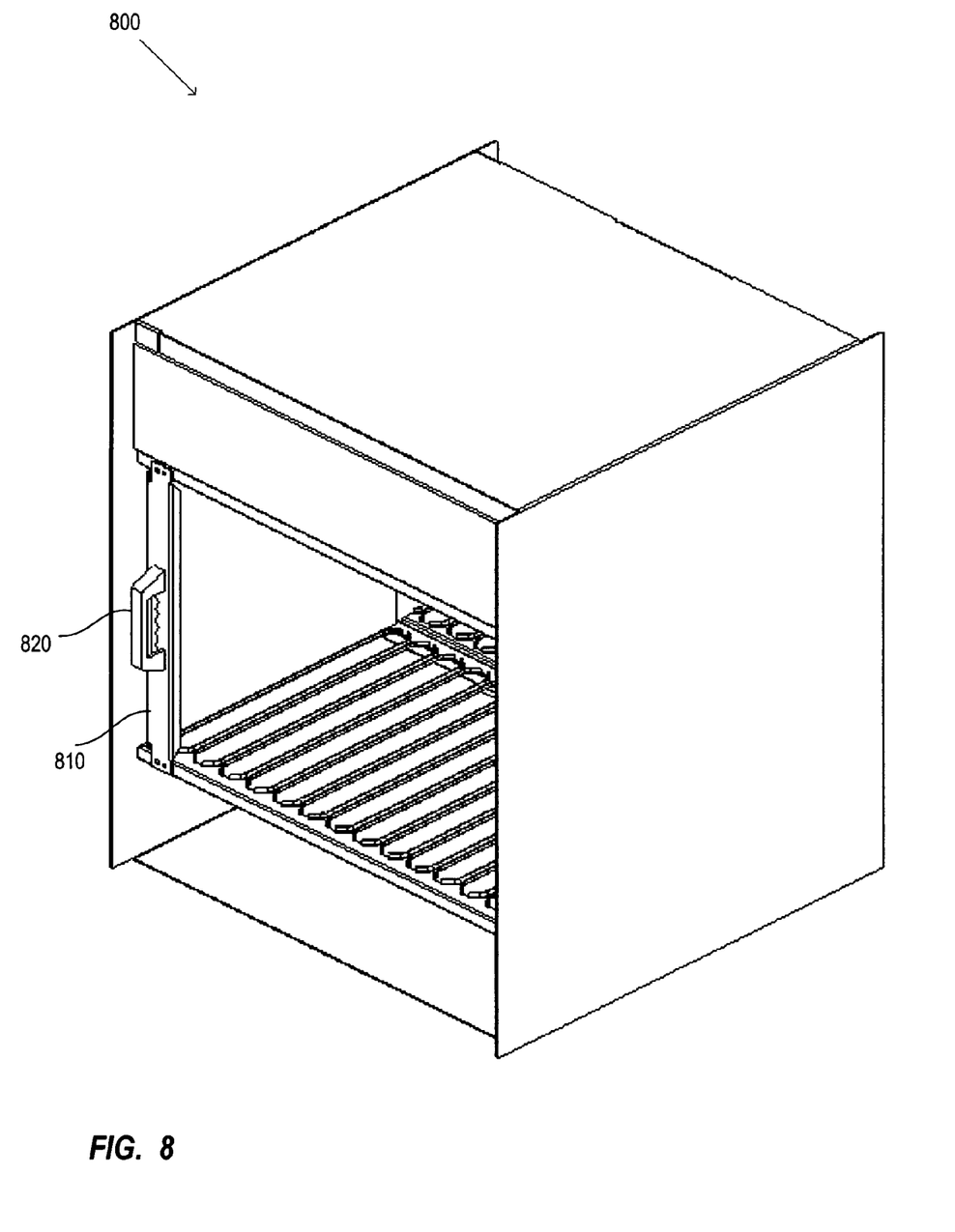
FIG. 8 illustrates a perspective view of a chassis having a board with an example latch mechanism, according to one embodiment.

FIG. 8 illustrates a perspective view of a chassis 800 with a board 810 with a latch mechanism 820 mounted on the face plate installed therein. Only a single board 810 is illustrated in the chassis 800 for simplicity.

According to one embodiment, when one board is about to be replaced for another board (a hot swap) the system needs to be prepared for the replacement. Accordingly, the system needs to be informed when a hot swap is about to be performed. One possibly for determining when a hot swap is about to be performed is to monitor when a latch (e.g., 760) is disengaged from the chassis. This can be performed by using a switch (e.g., plunger switch) that activates a hot swap signal when the switch is pushed in.

Figure 9A:
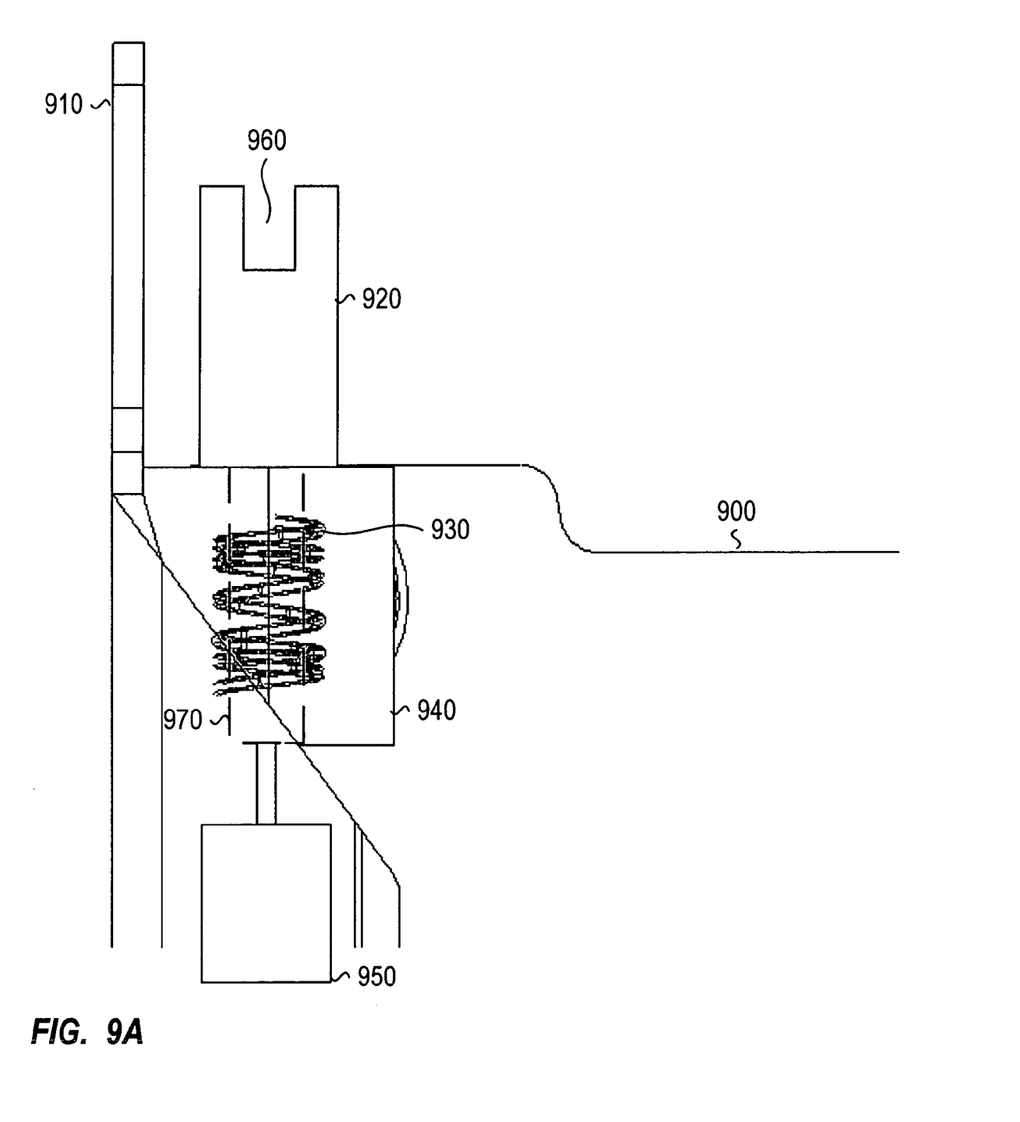
FIG. 9A illustrates an example extended (secured) latch assembly, according to one embodiment.

FIG. 9A illustrates an example extended (secured) latch assembly connected to a faceplate 910 of a board 900. The latch assembly is mounted to the faceplate 910 and includes a latch 920, a spring 930, a retainer 940 and a switch 950. The latch 920 includes a mating end 960 and a shaft 970. The mating end 960 engages the chassis and the shaft 970 is connected to the cable and has the spring 930 wound therearound. The retainer 940 holds the spring 930 and the latch 920 together and secures them to the face plate 910. The retainer 940 and the shaft 970 maintained in the retainer 940 rests on top of the switch 950. As the latch 920 is not being pulled by the cable the spring 930 and latch 920 are not retracted. Accordingly, the switch 950 is not activated (depressed) and the system would not be informed that a hot swap was about to occur.

Figure 9B:
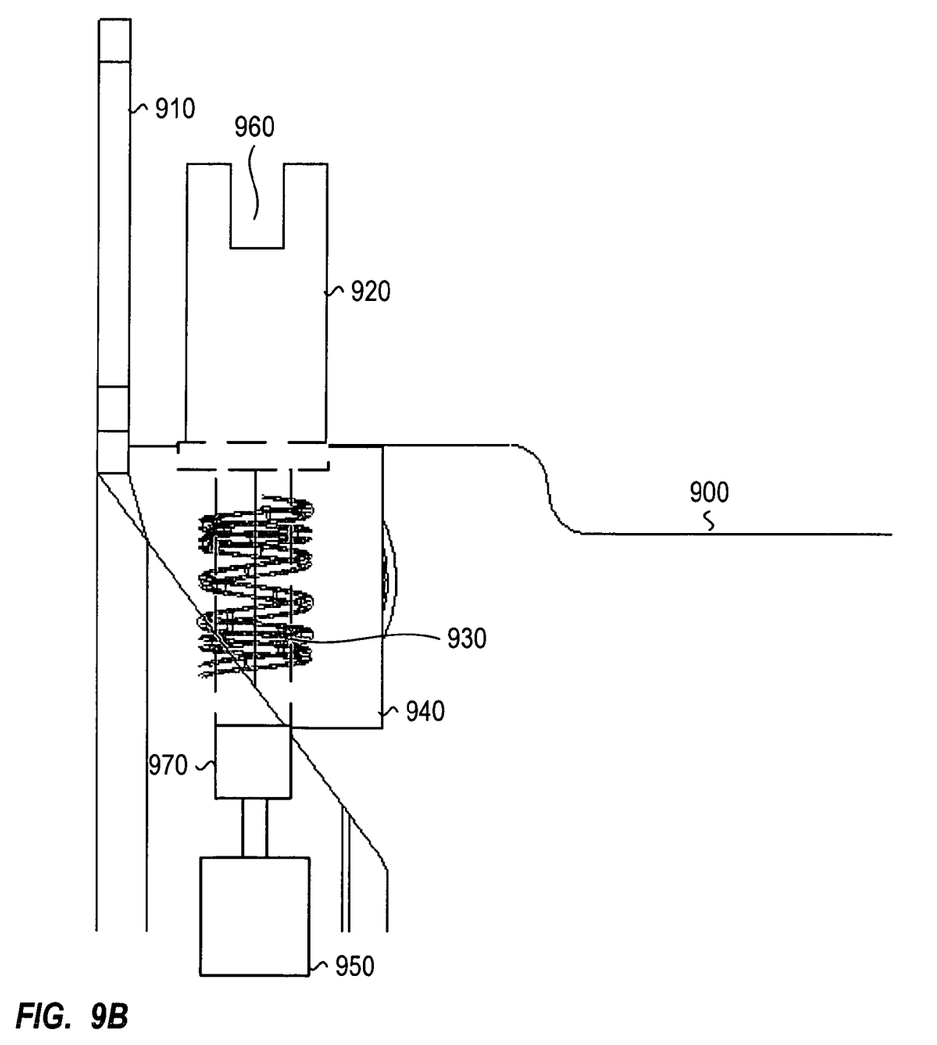
FIG. 9B illustrates an example retracted (non-secured) latch assembly, according to one embodiment.

FIG. 9B illustrates an example retracted (non-secured) latch assembly. The latch 930 is being pulled inward so that the spring 940 and the latch 930 are retracted. Accordingly, the shaft 970 extends past the retainer 940 and activates (depresses) the switch 950 activating a hot swap signal.

The activation of a hot swap signal is not limited to use of a switch, or monitoring of the latch assembly. Rather, numerous techniques could be used to initiate a hot swap signal without departing from the scope of the various embodiments.

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed is:

1. An apparatus comprising
a latch to connect a board to a chassis;
a pull lever to control whether said latch is retracted or extended, wherein said latch connects the board to the chassis when it is extended; and
a cable to connect said pull lever and said latch.

2. The apparatus of claim 1, wherein said latch is retracted if said pull lever is engaged by a user.

3. The apparatus of claim 1, wherein said latch is extended if said pull lever is not engaged by a user.

4. The apparatus of claim 1, wherein said latch includes a mating end to engage the chassis and a spring for retracting said latch.

5. The apparatus of claim 1, wherein the chassis is a telecommunications chassis.

6. The apparatus of claim 1, wherein the chassis is an Advanced Telecommunications Computing Architecture (ATCA) compliant chassis.

7. The apparatus of claim 1, wherein the chassis includes non-painted electrostatic discharge (EDS) terminals.

8. The apparatus of claim 1, wherein said apparatus is connected to a faceplate of the board.

9. The apparatus of claim 8, wherein said pull lever is connected to a front of the faceplate so that it is accessible from external to the chassis and said latch is connected to edges of the face plate so that it can connect to the chassis and secure the board to the chassis.

10. The apparatus of claim 9, further comprising a handle connected to the front of the face plate to enable a user to use the handle to hold the board.

11. The apparatus of claim 10, wherein said pull lever is integrated with said handle.

12. A telecommunications chassis comprising
a frame;
a housing to provide a plurality of slots within said frame, wherein a slot is used to vertically house a telecommunications board; and
a latch mechanism to manually control connectivity between the telecommunications board and said housing, wherein said latch mechanism is connected to a faceplate of the telecommunications board and includes
a pull lever having a stationary outer handle and an inner movable handle to enable a user to control said latching mechanism, wherein the pull lever is connected to a front of the faceplate;
a latch to selectively connect the telecommunications board to said housing based on the pull lever, wherein the latch is connected to edges of the faceplate, wherein the latch is retracted and connectivity between the latch and said housing is released when the pull lever is engaged, and wherein the latch includes a spring to return the latch to an extended position when the pull lever is disengaged; and
a cable connecting the pull lever and the latch.

13. The chassis of claim 12, wherein said latch mechanism further comprises a switch to determine when the latch is retracted and to generate a hot swap signal.

14. The chassis of claim 12, wherein the chassis is an Advanced Telecommunication Computing Architecture (ATCA) compliant chassis.

15. The chassis of claim 12, wherein the chassis includes a non-painted electrostatic discharge (ESD) terminal.

16. A method comprising utilizing a pull lever on a board in order to control a latch on the board via a cable connecting the pull lever to the latch, wherein the latch is used to secure the board to a chassis when the latch is extended, and wherein the latch is extended when the pull lever is not engaged by a user.

17. The method of claim 16, further comprising
engaging the pull lever so the latch is retracted;
inserting the board into the chassis; and
releasing the pull lever so that the latch is extended and the board is secured in the chassis.

18. The method of claim 16, further comprising
engaging the pull lever so that the latch is retracted and the board is released from the chassis; and
removing the board from the chassis.

19. The method of claim 16, wherein the board is a telecommunication board.

20. The method of claim 16, wherein the board and the chassis are Advanced Telecommunications Computer Architecture (ATCA) compliant.

21. A telecommunications chassis comprising
a frame;
a housing to provide a plurality of slots within said frame, wherein a slot is used to house a telecommunications board;
a latch to secure the telecommunications board to a slot wall, wherein said latch can be extended from the telecommunications board perpendicular to the slot wall to secure the telecommunications board within the slot; and
a pull lever to control when said latch is extended, wherein said pull lever includes a stationary outer handle and an inner movable handle, wherein movement of the inner movable handle controls said latch.

22. The chassis of claim 21, wherein said pull lever is connected to a front of a faceplate connected to the telecommunications board so that it accessible from external to the chassis and said latch is connected to edges of the faceplate.

23. The chassis of claim 21, wherein said latch is sloped so that it can be retracted for installation without being controlled by the pull lever.

24. The chassis of claim 21, wherein said pull lever and said latch are coupled.

25. The chassis of claim 24, wherein a cable is used to couple said pull lever to said latch.

* * * * *